USO11815572B2

(12) United States Patent
Tanase et al.

(10) Patent No.: US 11,815,572 B2
(45) Date of Patent: Nov. 14, 2023

(54) PSEUDO FORCE SENSE GENERATION APPARATUS

(71) Applicant: NIPPON TELEGRAPH AND TELEPHONE CORPORATION, Tokyo (JP)

(72) Inventors: Ryoma Tanase, Tokyo (JP); Hiroaki Gomi, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 90 days.

(21) Appl. No.: 17/428,260

(22) PCT Filed: Jan. 23, 2020

(86) PCT No.: PCT/JP2020/002208
§ 371 (c)(1),
(2) Date: Aug. 3, 2021

(87) PCT Pub. No.: WO2020/162191
PCT Pub. Date: Aug. 13, 2020

(65) Prior Publication Data
US 2022/0107373 A1 Apr. 7, 2022

(30) Foreign Application Priority Data
Feb. 5, 2019 (JP) ................. 2019-018509

(51) Int. Cl.
G06F 3/01 (2006.01)
G01R 33/09 (2006.01)
(52) U.S. Cl.
CPC .......... G01R 33/098 (2013.01); G06F 3/016 (2013.01)

(58) Field of Classification Search
None
See application file for complete search history.

(56) References Cited

U.S. PATENT DOCUMENTS

2010/0265176 A1 10/2010 Olsson et al.
2019/0086277 A1* 3/2019 Chen ...................... G06F 3/016
(Continued)

FOREIGN PATENT DOCUMENTS

JP 2006147671 A 6/2006
WO 2017183537 A1 10/2017

OTHER PUBLICATIONS

Amemiya et al. (2014) "Buru-Navi3: Behavioral Navigations Using Illusory Pulled Sensation Created by Thumb-sized Vibrator" Proc. of ACM SIGGRAPH Emerging Technologies, Aug. 10, 2014.

Primary Examiner — Carl Adams

(57) ABSTRACT

Provided is a pseudo force sensation providing device that can accurately measure an external magnetic field despite a small size thereof. Provided is a pseudo force sensation providing device including: an electrical actuator that performs physical movement based on a control signal supplied thereto; a contact mechanism that performs periodic asymmetric movement that causes a user to perceive pseudo force sensation, based on physical movement of the actuator; a magnetic sensor that measures an external magnetic field; and a shielding member that is provided between the actuator and the magnetic sensor, and surrounds a portion of the actuator on the side of the magnetic sensor, to block a magnetic field on the side of the magnetic sensor generated by the actuator.

10 Claims, 13 Drawing Sheets

(56) References Cited

U.S. PATENT DOCUMENTS

2019/0087063 A1 3/2019 Gomi et al.
2020/0127549 A1* 4/2020 Yosui .................. H02K 11/215

* cited by examiner

Fig. 8
Fig. 8A
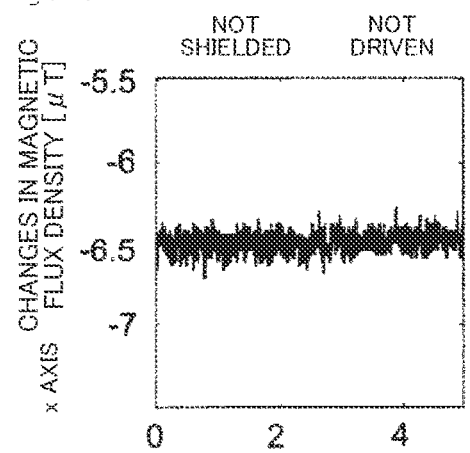
Fig. 8B
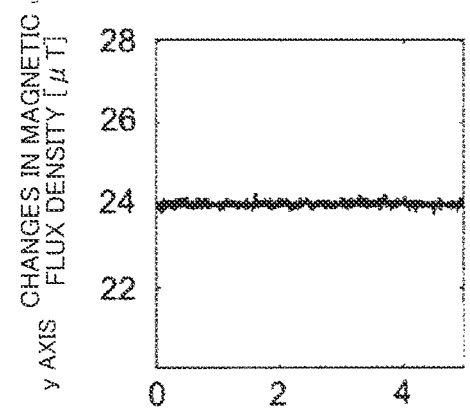
Fig. 8C
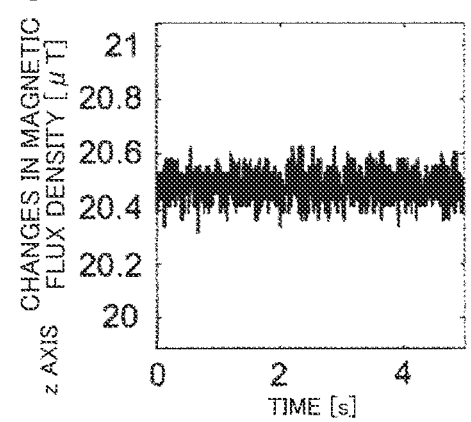
Fig. 8D
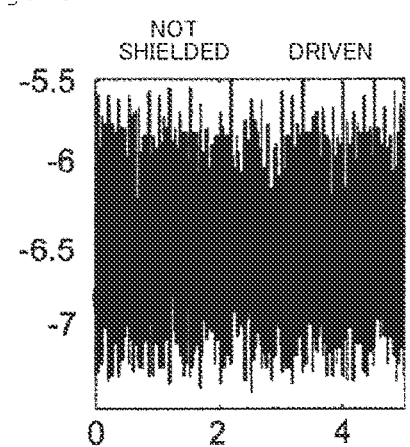
Fig. 8E
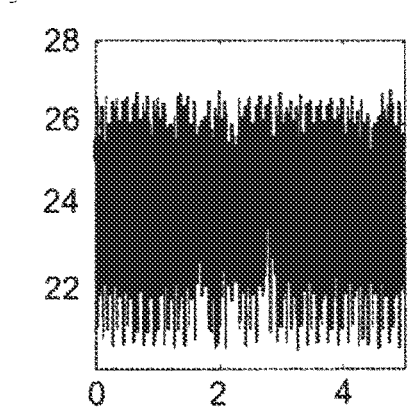
Fig. 8F
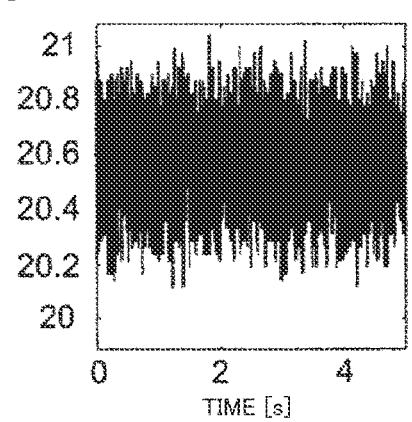

Fig. 9
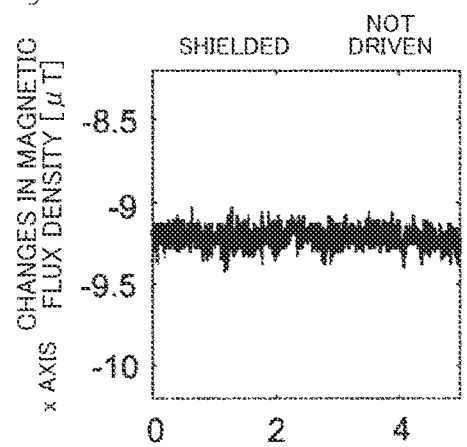
Fig. 9A
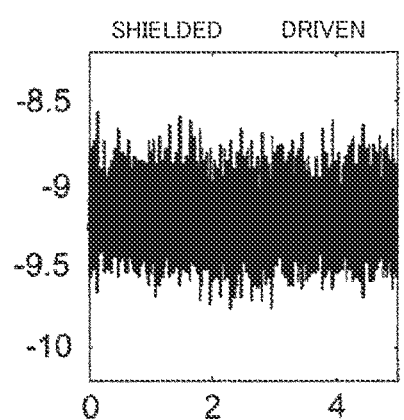
Fig. 9D
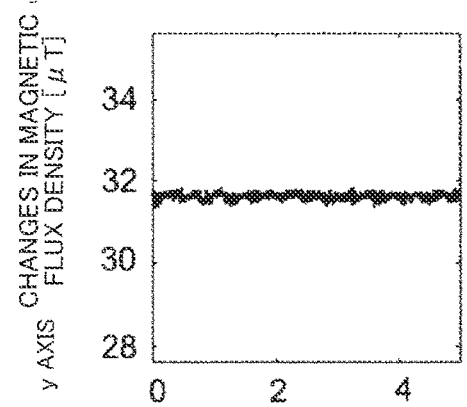
Fig. 9B
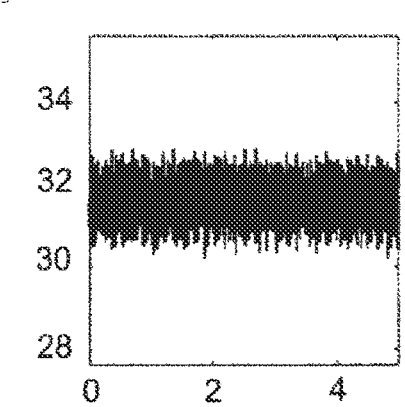
Fig. 9E
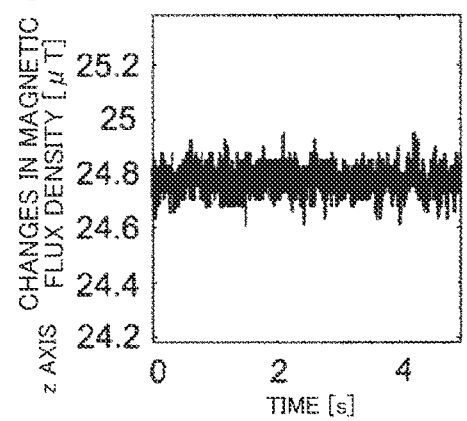
Fig. 9C
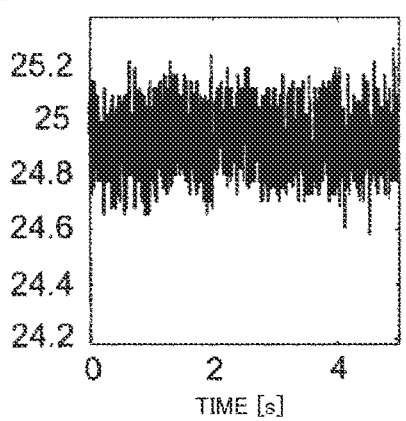
Fig. 9F Fig. 10
Fig. 10A
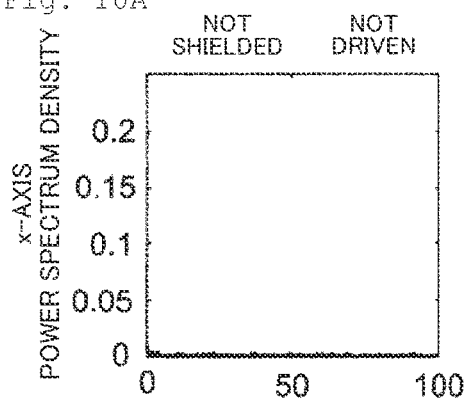
Fig. 10D
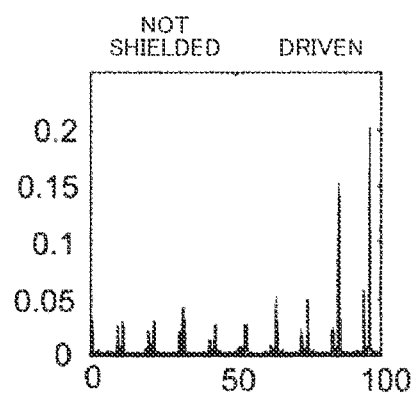
Fig. 10B
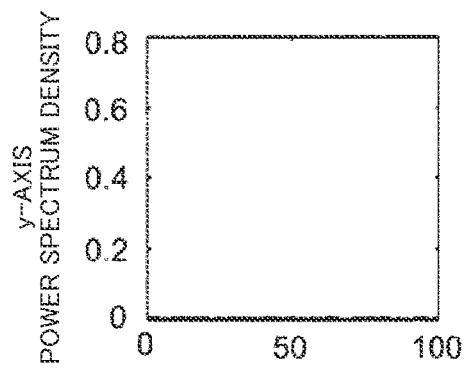
Fig. 10E
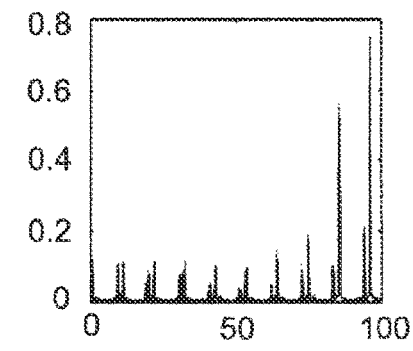
Fig. 10C
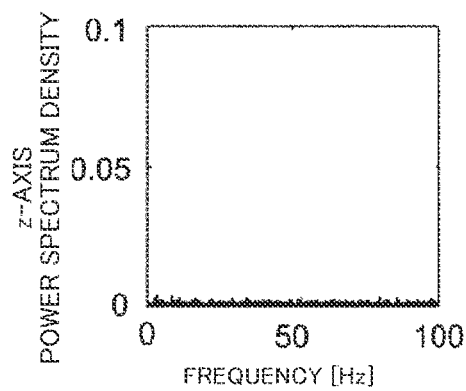
Fig. 10F
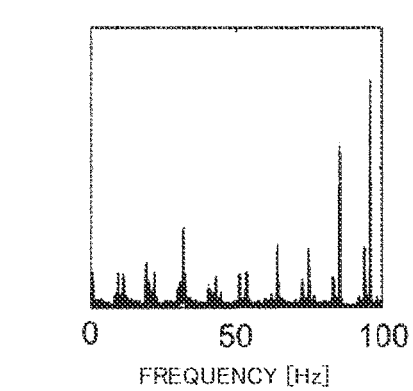

Fig. 11
Fig. 11A
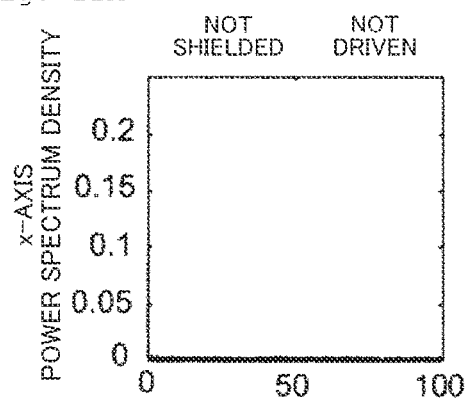
Fig. 11B
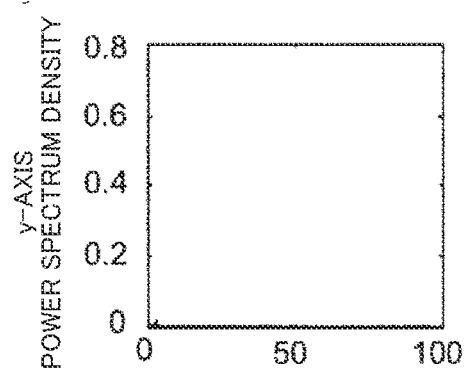
Fig. 11C
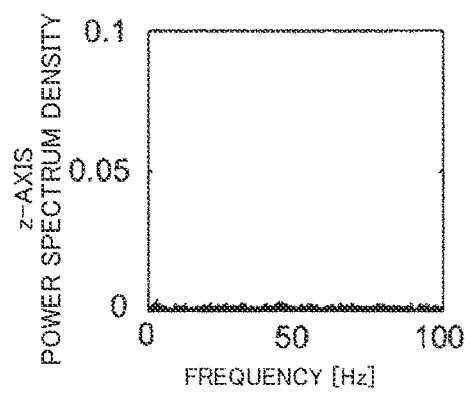
Fig. 11D
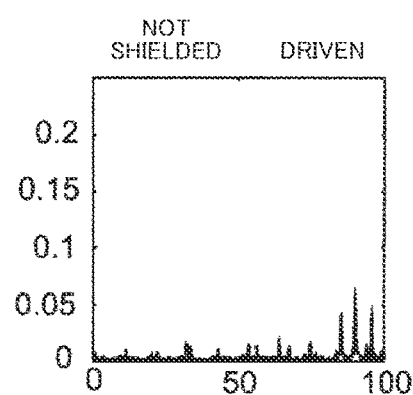
Fig. 11E
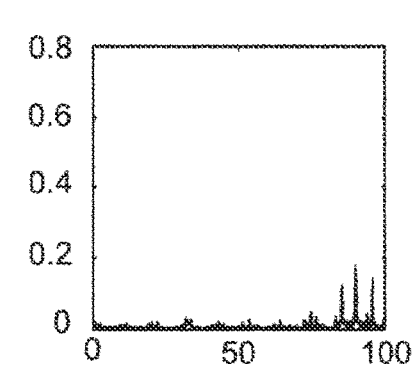
Fig. 11F
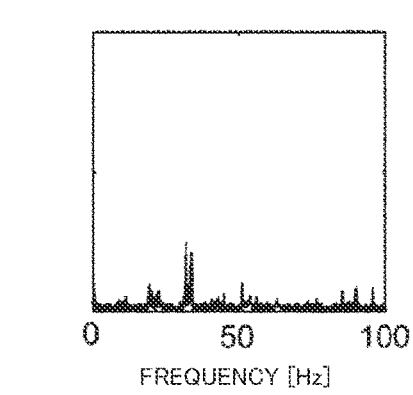

PSEUDO FORCE SENSE GENERATION APPARATUS

CROSS-REFERENCE TO RELATED APPLICATIONS

This application is a U.S. 371 Application of International Patent Application No. PCT/JP2020/002208, filed on 23 Jan. 2020, which application claims priority to and the benefit of JP Application No. 2019-018509, filed on 5 Feb. 2019, the disclosures of which are hereby incorporated herein by reference in their entireties.

TECHNICAL FIELD

The present invention relates to a pseudo force sensation providing device that provides a pseudo force sensation, and particularly to a pseudo force sensation providing device that has a magnetic sensor.

BACKGROUND ART

A system has been proposed that navigates pedestrian by using a pseudo force sensation generation device that controls an electric actuator based on a control signal and provides a pseudo force sensation such as an induced pulling illusion (NPL 1).

CITATION LIST

Non Patent Literature

[NPL 1] Tomohiro Amemiya, Hiroaki Gomi, "Buru-Navi3: Behavioral Navigations Using Illusory Pulled Sensation Created by Thumb-sized Vibrator", In Proc. of ACM SIGGRAPH 2014 Emerging Technologies, Vancouver, Canada, August 2014.

SUMMARY OF THE INVENTION

Technical Problem

According to NPL 1, the position of the user is measured by reading an AR marker attached to the ceiling, but it cannot be used outside. For outdoor use, it is possible to measure a position by using a GPS or a magnetic sensor, for example. However, if a magnetic sensor for detecting a position based on an external magnetic field is mounted on a pseudo force sensation providing device that uses an electric actuator as in NPL 1, the accuracy in measuring a position significantly decreases due to the influence of the magnetic field generated by the actuator. If the distance between the actuator and the magnetic sensor is increased in order to reduce the influence of the magnetic field generated by the actuator, the size of the pseudo force sensation generation device increases and it becomes difficult to grip it with one hand.

An object of the present invention is to provide an electric pseudo force sensation providing device that can accurately measure an external magnetic field despite its (small) size that allows a user to grasp the device with one hand.

Means for Solving the Problem

To solve the above-described problem, the present invention provides a pseudo force sensation providing device including: an electrical actuator that performs physical movement based on a control signal supplied thereto; a contact mechanism that performs periodic asymmetric movement that causes a user to perceive pseudo force sensation, based on physical movement of the actuator; a magnetic sensor that measures an external magnetic field; and a shielding member that is provided between the actuator and the magnetic sensor, and surrounds a portion of the actuator on the side of the magnetic sensor, to block a magnetic field on the side of the magnetic sensor generated by the actuator.

Effects of the Invention

According to the present invention, the shielding member blocks a magnetic wave travelling from the actuator to the magnetic sensor, and therefore it is possible to appropriately measure an external magnetic field despite a short distance between the actuator and the magnetic sensor. Thus, it is possible to provide a pseudo force sensation providing device that can accurately measure an external magnetic field despite a small size thereof.

BRIEF DESCRIPTION OF DRAWINGS

FIGS. 4A and 4B show schematic cross sections along 3A-3A of the actuator according to the first embodiment.

FIGS. 8A, 8B, and 8C illustrate graphs respectively illustrating changes in magnetic flux density [μT] in the x-axis direction, the y-axis direction, and the z-axis direction plotted at each point in time [s] in the case where a magnetic field generated by an actuator is not blocked (NOT SHIELDED) and the actuator is not driven (NOT DRIVEN), and FIGS. 8D, 8E, and 8F illustrate graphs respectively illustrating changes in magnetic flux density [μT] in the x-axis direction, the y-axis direction, and the z-axis direction plotted at each point in time [s] in the case where the magnetic field generated by the actuator is not blocked (NOT SHIELDED) and the actuator is driven (DRIVEN).

FIGS. 9A, 9B, and 9C illustrate graphs respectively illustrating changes in magnetic flux density [µT] in the x-axis direction, the y-axis direction, and the z-axis direction plotted at each point in time [s] in the case where the magnetic field generated by the actuator is blocked and the actuator is not driven, and FIGS. 9D, 9E, and 9F illustrate graphs respectively illustrating changes in magnetic flux density [µT] in the x-axis direction, the y-axis direction, and the z-axis direction plotted at each point in time [s] in the case where the magnetic field generated by the actuator is blocked and the actuator is driven.

FIGS. 10A, 10B, and 10C illustrate graphs respectively illustrating changes in power spectrum density in the x-axis direction, the y-axis direction, and the z-axis direction plotted at each frequency [Hz] in the case where the magnetic field generated by the actuator is not blocked and the actuator is not driven, and FIGS. 10D, 10E, and 10F illustrate graphs respectively illustrating changes in power spectrum density in the x-axis direction, the y-axis direction, and the z-axis direction plotted at each frequency [Hz] in the case where the magnetic field generated by the actuator is not blocked and the actuator is driven.

FIGS. 11A, 11B, and 11C illustrate graphs respectively illustrating changes in power spectrum density in the x-axis direction, the y-axis direction, and the z-axis direction plotted at each frequency [Hz] in the case where the magnetic field generated by the actuator is not blocked and the actuator is driven, and FIGS. 11D, 11E, and 11F illustrate graphs respectively illustrating changes in power spectrum density in the x-axis direction, the y-axis direction, and the z-axis direction plotted at each frequency [Hz] in the case where the magnetic field generated by the actuator is not blocked and the actuator is driven.

DESCRIPTION OF EMBODIMENTS

Figure 1:
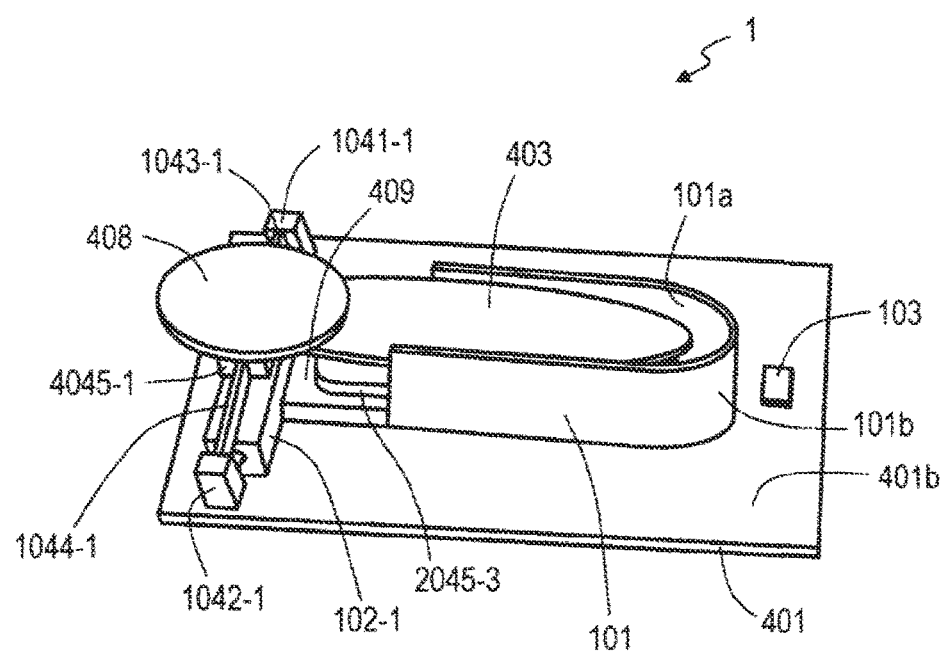
FIG. 1 is a perspective view illustrating a pseudo force sensation providing device according to a first embodiment.
Figure 2:
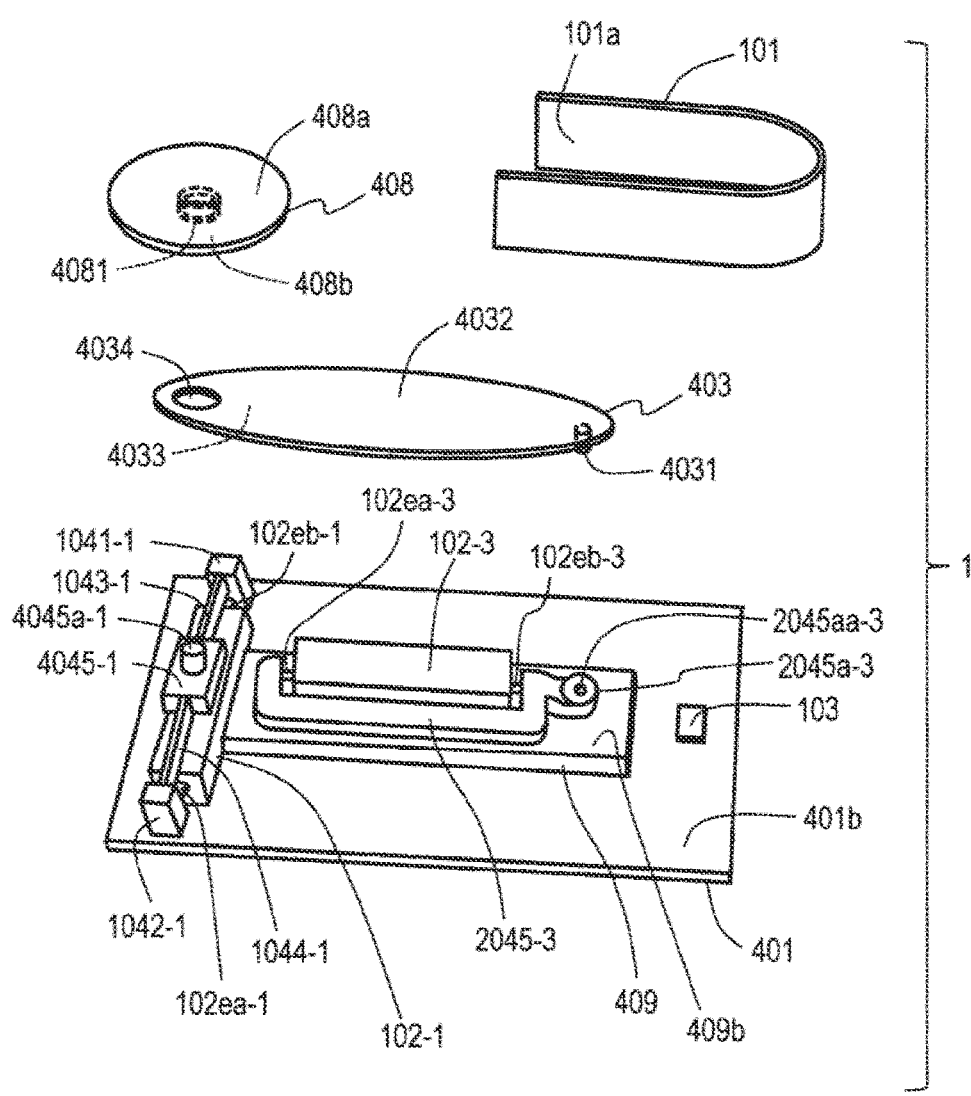
FIG. 2 is an exploded perspective view illustrating the pseudo force sensation providing device according to the first embodiment.
Figure 3A:
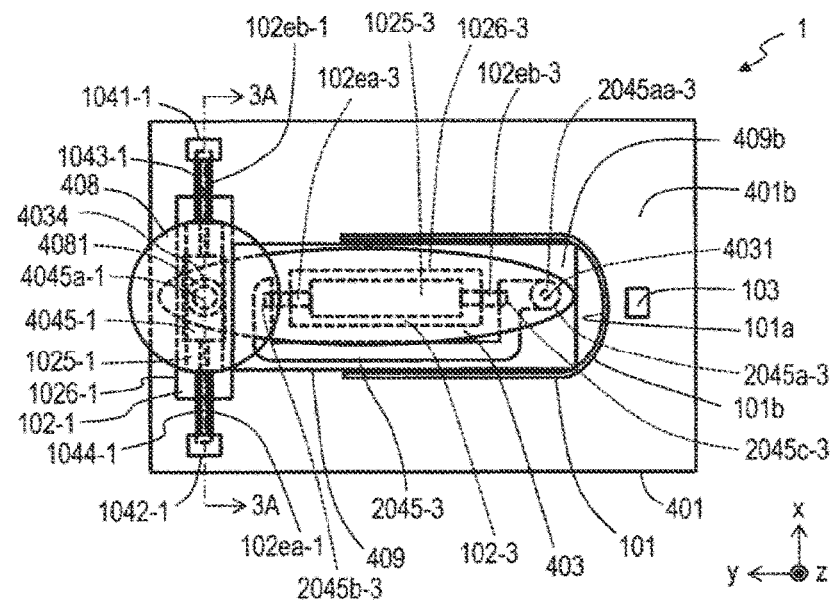
FIG. 3A is a transparent plan view illustrating a configuration of the pseudo force sensation generation device according to the first embodiment.
Figure 3B:
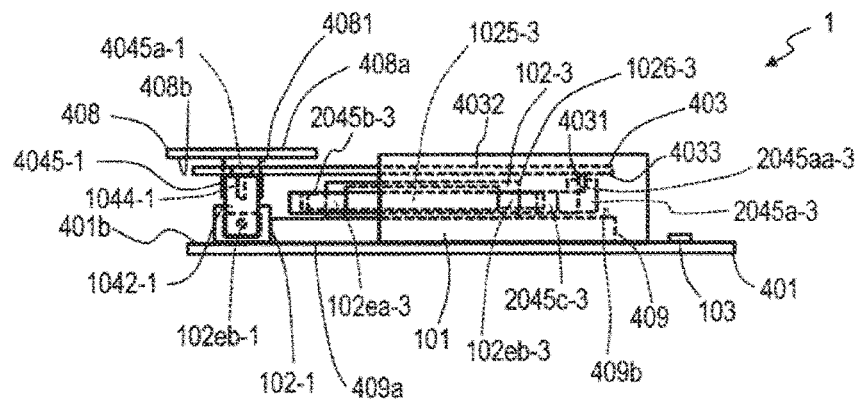
FIG. 3B is a transparent front view illustrating the configuration of the pseudo force sensation generation device according to the first embodiment.
Figure 3C:
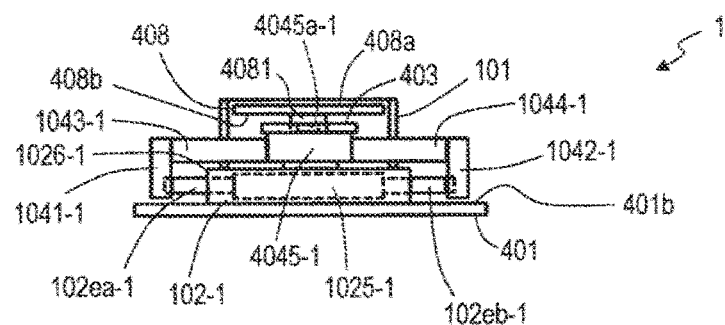
FIG. 3C is a transparent left view illustrating the configuration of the pseudo force sensation generation device according to the first embodiment.

Hereinafter, embodiments of the present invention will be described with reference to the drawings.

First Embodiment

First, a first embodiment will be described.

A pseudo force sensation generation device 1 according to the present embodiment will be described with reference to FIGS. 1 to 5. As illustrated in FIGS. 1 to 5, the pseudo force sensation generation device 1 according to the present embodiment includes a base portion 401, actuators 102-$i$ (where i=1, 3), leaf spring portions 1043-1 and 1044-1, coupling portions 1041-1 and 1042-1, a fixing portion 4045-1, a coupling portion 2045-3, a seat 409, a connection portion 403, a contact portion 408, a shielding member 101, and a magnetic sensor 103. The actuator 102-$i$ (where i=1, 3) includes a support portion 1026-$i$, a movable portion 1025-$i$, a coupling portion 102ea-$i$, and a coupling portion 102eb-$i$.

A mechanism that includes the base portion 401, the seat 409, and the support portions 1026-1 and 1026-3 (for example a mechanism constituted by them) is equivalent to the "base mechanism". A mechanism that includes the movable portions 1025-$i$, the coupling portions 102ea-$i$ and 102eb-$i$ (where i–1, 3), the leaf spring portions 1043-1 and 1044-1, the fixing portion 4045-1, the coupling portion 2045-3, the connection portion 403, and the contact portion 408 (for example, a mechanism constituted by them) is equivalent to the "contact mechanism". The "contact mechanism" performs periodic asymmetric movement relative to the "base mechanism" to apply a force that is based on the asymmetric movement to the skin that is in direct or indirect contact with the contact mechanism, and thus make the user perceive a pseudo force sensation.

<Base Portion 401>

The base portion 401 is a plate-shaped member that is made of a synthetic resin such as an ABS resin. An example of the base portion 401 is an electronic circuit board on which electronic components are mounted (for example, a circuit board of a smartphone terminal device). The bottom surface of the actuator 102-1 (the bottom surface of the support portion 1026-1) and one plate surface 409a of the plate-shaped seat 409 is fixed to one plate surface 401b of the base portion 401. The bottom surface of the actuator 102-3 (the bottom surface of the support portion 1026-3) is fixed to the other plate surface 409b of the seat 409. The angle formed between the lengthwise direction of the fixed actuator 102-1 and the lengthwise direction of the actuator 102-3 is substantially 90 degrees. The lengthwise direction of the actuator 102-1 extends along one side of the base portion 401, the lengthwise direction of the actuator 102-3 is substantially orthogonal to this side, and a central portion of the actuator 102-1 is located at a position in an extension from the actuator 102-3 in the lengthwise direction thereof.

<Actuator 102-$i$>

The actuator 102-$i$ (where i=1, 3) includes the support portion 1026-$i$, the movable portion 1025-$i$ that performs asymmetric vibration relative to the support portion 1026-$i$, the rod-shaped coupling portion 102eb-$i$ that is connected to or formed integrally with one end of the movable portion 1025-$i$ in the lengthwise direction thereof and extends in the lengthwise direction, and the coupling portion 102ea-$i$ that is connected to or formed integrally with the other end of the movable portion 1025-$i$ in the lengthwise direction thereof and extends in the lengthwise direction.

Figure 4A:
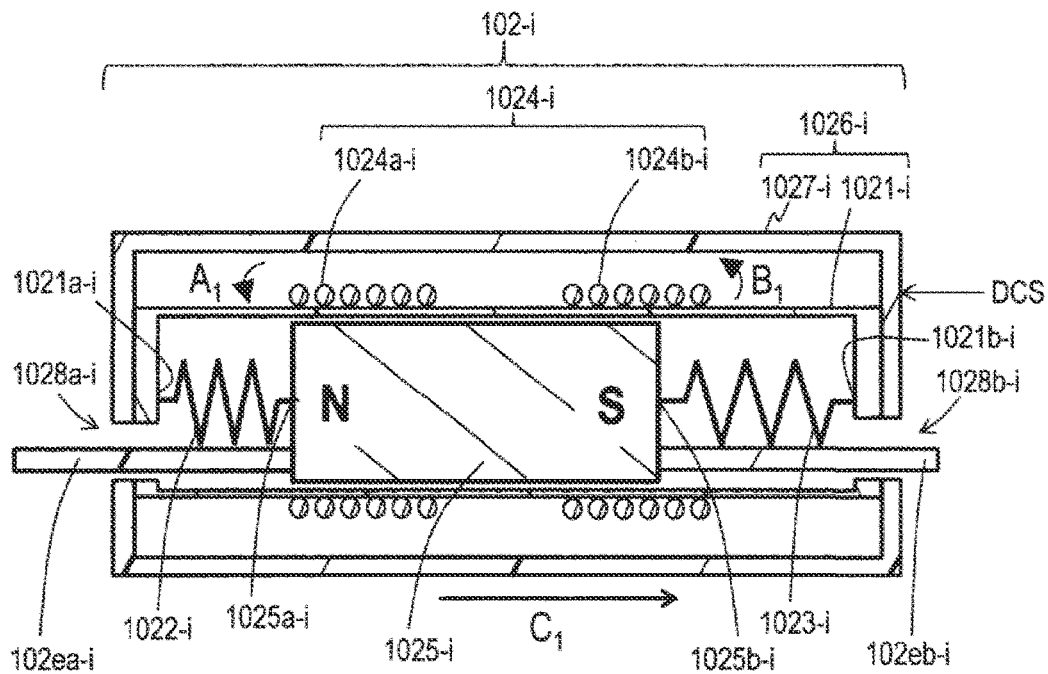
FIGS. 4A and 4B are conceptual diagrams illustrating a configuration of an actuator according to the first embodiment.
Figure 4B:
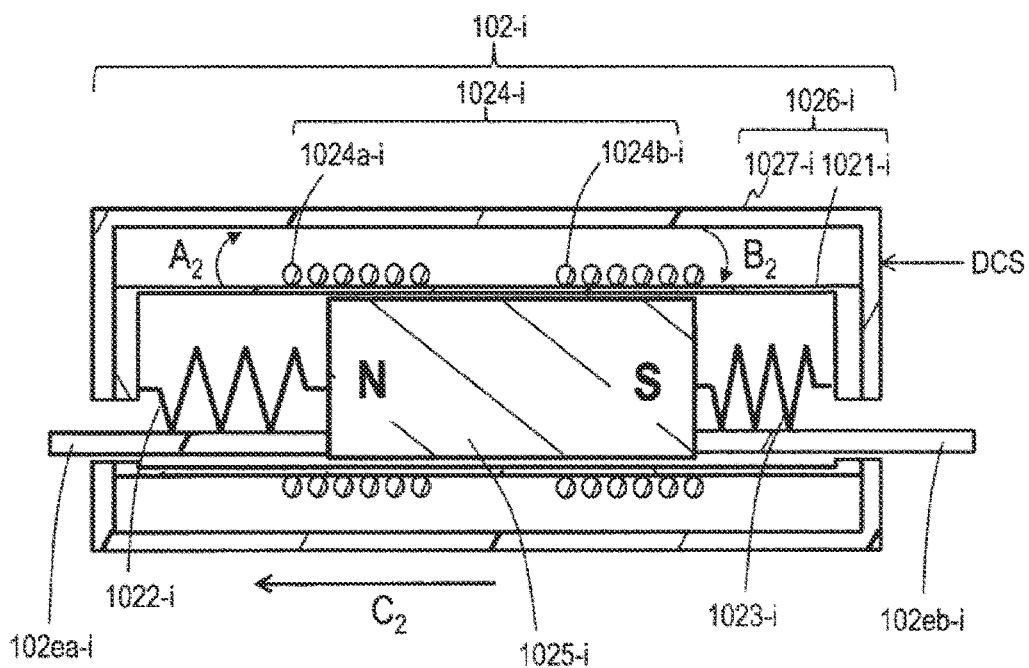

The configuration of the actuators 102-$i$ is disclosed in Reference Literature 1 (WO 2017/183537), for example. As illustrated in FIGS. 4A and 4B, the actuators 102-$i$ is an electrical actuator that performs physical movement based on a control signal supplied thereto. The actuator 102-$i$ is a linear actuator that includes a support portion 1026-$i$ that includes a case 1027-$i$ and a guide 1021-$i$, springs 1022-$i$ and 1023-$i$ (elastic members), a coil 1024-$i$, a movable portions 1025-$i$ that is a permanent magnet, and coupling portions 102ea-$i$ and 102eb-$i$, for example. The case 1027-$i$ and the guide 1021-$i$ according to the present embodiment are both hollow members each having a shape in which the two open ends of a cylinder (for example, a circular cylinder or a polygonal cylinder) are partially closed. However, the guide 1021-$i$ is smaller than the case 1027-$i$, and has a size that can be housed in the case 1027-$i$. The case 1027-$i$, the guide 1021-$i$, and the coupling portions 102ea-$i$ and 102eb-$i$ are made of a synthetic resin, for example. The springs 1022-$i$ and 1023-$i$ are coil springs or leaf springs made of metal, for example. Although it is preferable that the elastic modulus (spring constants) of the springs 1022-$i$ and 1023-$i$ are the same, they may be different from each other. The movable portion 1025-$i$ is, for example, a cylindrical permanent magnet, and one end portion 1025$a$-$i$ thereof in the longitudinal direction is the N pole and the other end portion 1025$b$-$i$ thereof is the S pole. The coil 1024-$i$ is, for example, a continuous enamel wire, and has a first winding portion 1024$a$-$i$ and a second winding portion 1024$b$-$i$.

The movable portion 1025-$i$ is housed in the guide 1021-$i$, and supported there so as to be slidable in the lengthwise direction. Although the details of such a support mechanism are not described, for example, a rail that extends straight in the longitudinal direction is provided on the inner wall surface of the guide 1021-$i$, and a rail support portion that supports the rail so as to be slidable is provided on the side surface of the movable portion 1025-$i$. One end of the spring 1022-$i$ is fixed to an inner wall 1021$a$-$i$ on one end side of the guide 1021-$i$ in the longitudinal direction (i.e. one end of the spring 1022-$i$ is supported by the guide 1021-$i$), and the other end of the spring 1022-$i$ is fixed to an end 1025$a$-$i$ of the movable portion 1025-$i$ (i.e. the end 1025$a$-$i$ of the movable portion 1025-$i$ is supported by the other end of the spring 1022-$i$). Also, one end of the spring 1023-$i$ is fixed to an inner wall surface 1021$b$-$i$ on the other end side of the guide 1021-$i$ in the longitudinal direction (i.e. one end of the spring 1023-$i$ is supported by the guide 1021-$i$), and the other end of the spring 1023-$i$ is fixed to an end 1025$b$-$i$ of the movable portion 1025-$i$ (i.e. the end 1025$b$-$i$ of the movable portion 1025-$i$ is supported by the other end of the spring 1023-$i$).

The coil 1024-$i$ is wound around the outer circumferential side of the guide 1021-$i$. However, note that the first winding portion 1024$a$-$i$ is wound in an $A_1$ direction (the direction from the far side to the front side) around the end 1025$a$-$i$ side (the N pole side) of the movable portion 1025-$i$, and the second winding portion 1024$b$-$i$ is wound in a $B_1$ direction (from the front side to the far side) opposite to the $A_1$ direction around the end 1025$b$-$i$ side (the S pole side). That is to say, when seen from the end 1025$a$-$i$ side (the N pole side) of the movable portion 1025-$i$, the first winding portion 1024$a$-$i$ is wound clockwise, and the second winding portion 1024$b$-$i$ is wound counterclockwise. In addition, in a state where the movable portion 1025-$i$ has been stopped and elastic forces from the springs 1022-$i$ and 1023-$i$ are balanced, it is preferable that the end 1025$a$-$i$ side (the N pole side) of the movable portion 1025-$i$ is located in an area for the first winding portion 1024$a$-$i$ and the end 1025$b$-$i$ side (the S pole side) is located in an area for the second winding portion 1024$b$-$i$.

The guide 1021-$i$, the springs 1022-$i$ and 1023-$i$, the coil 1024-$i$, and the movable portion 1025-$i$ configured and arranged as described above are housed in the case 1027-$i$, and the guide 1021-$i$ is fixed inside the case 1027-$i$. That is to say, the position of the case 1027-$i$ is fixed relative to the guide 1021-$i$. Note that the longitudinal direction of the case 1027-$i$ coincides with the longitudinal direction of the guide 1021-$i$ and the longitudinal direction of the movable portion 1025-$i$.

A through hole 1028$a$-$i$ is provided on the inner wall 1021$a$-$i$ of the case 1027-$i$ and the guide 1021-$i$, and a through hole 1028$b$-$i$ is provided on the inner wall surface 1021$b$-$i$ side. The rod-shaped coupling portion 102$ea$-$i$ is inserted into the through hole 1028$a$-$i$, and the rod-shaped coupling portion 102$eb$-$i$ is inserted into the through hole 1028$b$-$i$. One end of the coupling portion 102$ea$-$i$ is in contact with the end 1025$a$-$i$ of the movable portion 1025-$i$ and the other end of the coupling portion 102$ea$-$i$ is located outside the case 1027-$i$ (the support portion 1026-$i$). One end of the coupling portion 102$eb$-$i$ is in contact with the end 1025$b$-$i$ of the movable portion 1025-$i$ and the other end of the coupling portion 102$eb$-$i$ is located outside the case 1027-$i$ (the support portion 1026-$i$).

The coil 1024-$i$ applies a force corresponding to the current flowing therethrough, to the movable portion 1025-$i$, and thus the movable portion 1025-$i$ performs periodic asymmetric vibration relative to the guide 1021-$i$ (periodic asymmetric translational reciprocating movement in an axial direction relative to the guide 1021-$i$). That is to say, when a current is applied to the coil 1024-$i$ in the $A_1$ direction (the $B_1$ direction), a force is applied to the movable portion 1025-$i$ in a $C_1$ direction (in the direction from the N pole to the S pole of the movable portion 1025-$i$: rightward) due to the reaction of the Lorentz force that can be explained according to the Fleming's left-hand rule (FIG. 4A). Conversely, when a current is applied to the coil 1024-$i$ in an $A_2$ direction (a $B_2$ direction), a force is applied to the movable portion 1025-$i$ in a $C_2$ direction (in the direction from the S pole to the N pole of the movable portion 1025-$i$: leftward) (FIG. 4B). Note that the $A_2$ direction is opposite to the $A_1$ direction. Through these operations, motion energy is applied to the series including the movable portion 1025-$i$ and the springs 1022-$i$ and 1023-$i$. Thus, it is possible to change the position and the acceleration of the movable portion 1025-$i$ relative to the case 1027-$i$ (the position and the acceleration in the axial direction relative to the guide 1021-$i$), and accordingly change the positions and the accelerations of the coupling portions 102$ea$-$i$ and 102$eb$-$i$. That is to say, the movable portion 1025-$i$ performs asymmetric vibration relative to the support portion 1026-$i$ along a D-$i$ axis (FIG. 5) in the state of being supported by the support portion 1026-$i$, based on a given drive control signal DCS, and simultaneously the coupling portions 102$ea$-$i$ and 102$eb$-$i$ perform asymmetric vibration along the D-$i$ axis.

Note that the configuration of the actuator 102-$i$ is not limited to that shown in FIGS. 4A and 4B. For example, it is possible to employ a configuration in which the first winding portion 1024$a$-$i$ of the coil 1024-$i$ is wound around the end 1025$a$-$i$ of the movable portion 1025-$i$ in the $A_1$ direction, and the coil 1024-$i$ is not wound around the end 1025$b$-$i$. Conversely, it is possible to employ a configuration in which the second winding portion 1024$b$-$i$ of the coil 1024-$i$ is wound around the end 1025$b$-$i$ in the $B_1$ direction, and the coil 1024-$i$ is not wound around the end 1025$a$-$i$ of the movable portion 1025-$i$. Alternatively, the first winding portion 1024$a$-$i$ and the second winding portion 1024$b$-$i$ may be of different coils. That is to say, it is possible to employ a configuration in which the first winding portion 1024$a$-$i$ and the second winding portion 1024$b$-$i$ are not electrically connected to each other, and different electrical signals are respectively applied thereto.

Figure 5:
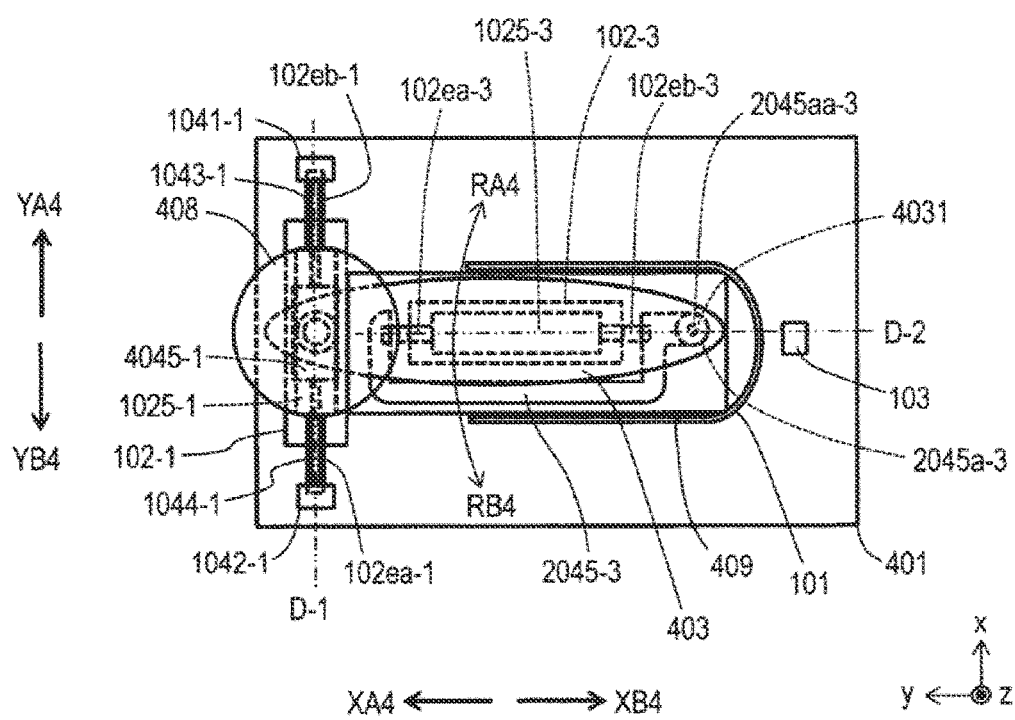
FIG. 5 is a diagram for illustrating operations of the pseudo force sensation generation device according to the first embodiment.
Figure 6A:
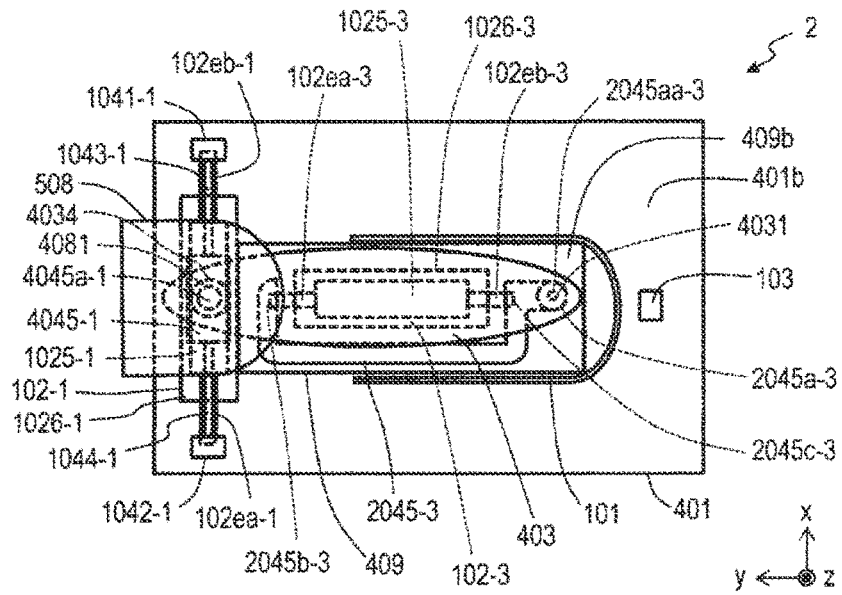
FIG. 6A is a transparent plan view illustrating a configuration of a pseudo force sensation generation device according to a second embodiment.
Figure 6B:
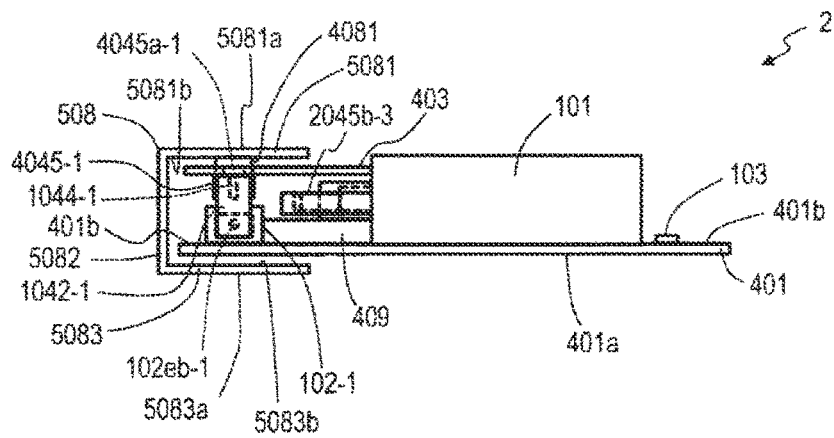
FIG. 6B is a transparent front view illustrating the configuration of the pseudo force sensation generation device according to the second embodiment.
Figure 6C:
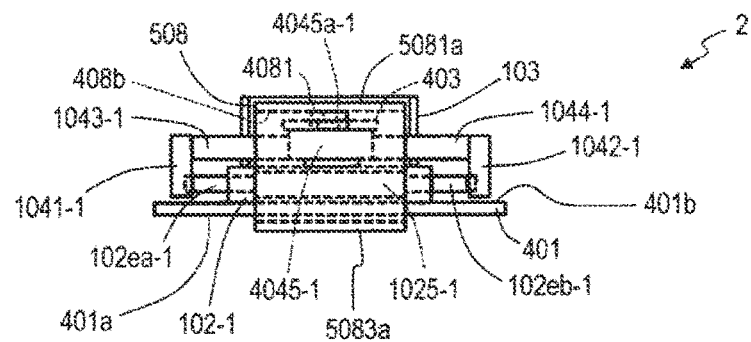
FIG. 6C is a transparent left view illustrating the configuration of the pseudo force sensation generation device according to the second embodiment.

As illustrated in FIG. 5, the movable portion 1025-$i$ can perform asymmetric vibration relative to the support portion 1026-$i$ along the D-$i$ axis that passes through the coupling portions 102$ea$-$i$ and 102$eb$-$i$, in the state of being supported by the support portion 1026-$i$. The vibration direction (the axial direction of the D-$i$ axis) of each asymmetric vibration is substantially parallel with the plate surface 401$b$ of the base portion 401, and the angle formed by the D-1 axis and the D-2 axis is substantially 90 degrees.

<Coupling Portions 1041-1 and 1042-1>

The coupling portions 1041-1 and 1042-1 are columnar rigid members or members that can be regarded as rigid members. The coupling portions 1041-1 and 1042-1 are made of a synthetic resin, for example. The other end of the coupling portion 102ea-1 located outside the support portion 1026-1 supports the side surface of one end of the coupling portion 1042-1. The other end of the coupling portion 102eb-1 located outside the support portion 1026-1 supports the side surface of one end of the coupling portion 1041-1. The coupling portion 1041-1 is located outside the one end of the actuator 102-1 in the longitudinal direction, and the coupling portion 1042-1 is located outside the other end of the actuator 102-1 in the longitudinal direction. The coupling portion 1041-1 and the coupling portion 1042-1 are provided substantially parallel with each other.

<Leaf Spring Portions 1043-1 and 1044-1 and Fixing Portion 4045-1>

The leaf spring portions 1043-1 and 1044-1 are plate-shaped springs that are made of a synthetic resin. One end of the leaf spring portion 1043-1 and one end of the leaf spring portion 1044-1 are respectively supported by the coupling portions 1041-1 and 1042-1. The other end of the leaf spring portion 1043-1 and the other end of the leaf spring portion 1044-1 are supported by the fixing portion 4045-1. The fixing portion 4045-1 is a plate-shaped member that has a cylindrical protrusion 4045a-1. The fixing portion 4045-1 may be made of a synthetic resin, for example. The protrusion 4045a-1 is provided outward of the fixing portion 4045-1 (on the side opposite to the actuator 102-1). The leaf spring portion 1043-1 and the leaf spring portion 1044-1 are arranged in a direction along the D-1 axis, and the fixing portion 4045-1 is provided between the leaf spring portion 1043-1 and the leaf spring portion 1044-1.

<Coupling Portion 2045-3>

The coupling portion 2045-3 is a substantially G-shaped member that is made of a synthetic resin or the like. The other end of the coupling portion 102ea-3 located outside the support portion 1026-3 of the actuator 102-3 supports one end 2045b-3 of the coupling portion 2045-3. The other end of the coupling portion 102eb-3 located outside the support portion 1026-3 supports the other end 2045c-3 of the coupling portion 2045-3. The axial direction of the one end 2045b-3 and the other end 2045c-3 of the coupling portion 2045-3 and the coupling portions 102ea-3 and 102eb-3 extends along the D-2 axis. A support portions 2045a-3 that is provided with an insertion hole 2045aa-3 is provided on the other end 2045c-3 side of the coupling portion 2045-3. The angle formed by the axial direction of the central axis of the insertion hole 2045aa-3 and the D-1 axis, and the angle formed by the axial direction of the central axis of the insertion hole 2045aa-3 and the D-2 axis, are both substantially 90 degrees. Upon the actuator 102-3 being driven, the coupling portion 2045-3 performs asymmetric vibration in the D-2 axis direction, relative to the base portion 201.

<Connection Portion 403 and Contact Portion 408>

The connection portion 403 is a plate-shaped member that is made of a synthetic resin or the like, and the contact portion 408 is a disc-shaped member that is made of a synthetic resin or the like. A cylindrical pivot shaft 4031 is provided on one plate surface 4033 of one end portion of the connection portion 403. A through hole 4034 that penetrates through the plate surface 4033 and a plate surface 4032 on the opposite side thereof is provided in the other end portion of the connection portion 403. The open end of the through hole 4034 is circular, and the inner diameter of the through hole 4034 is larger than the outer diameter of the end surface of the protrusion 4045a-1. A cylindrical protrusion 4081 that has a circular cylinder shape and the leading end there of is open is provided in a central area of one plate surface 408b of the contact portion 408. The axial direction of the cylindrical protrusion 4081 is substantially orthogonal to the plate surface 408b. The outer diameter of the cylindrical protrusion 4081 is slightly smaller than the inner diameter of the through hole 4034, and the inner diameter of the cylindrical protrusion 4081 is substantially the same as the outer diameter of the end surface of the protrusion 4045a-1.

The connection portion 403 is orientated such that the plate surface 4033 faces toward the plate surface 409b of the seat 409 (toward the plate surface 401b of the base portion 401). The pivot shaft 4031 of the connection portion 403 is pivotally supported in the insertion hole 2045aa-3. The protrusion 4045a-1 of the fixing portion 4045-1 is inserted into the through hole 4034 of the connection portion 403 from the plate surface 4033 side. The cylindrical protrusion 4081 of the contact portion 408 is inserted into the through hole 4034 of the connection portion 403 from the plate surface 4032 side. The protrusion 4045a-1 that penetrates through the through hole 4034 is inserted into and fixed to the inner wall surface of the cylindrical protrusion 4081. Thus, the other end of the connection portion 403 and the contact portion 408 are attached to the fixing portion 4045-1.

Magnetic Sensor 103

The magnetic sensor 103 is fixed to the plate surface 401b of the base portion 401. The magnetic sensor 103 is a sensor for measuring the size and the direction of the external magnetic field of the pseudo force sensation generation device 1. An example of the magnetic sensor 103 is a geomagnetic sensor. The magnetic sensor 103 according to the present embodiment is provided in the vicinity of the actuator 102-3. The magnetic sensor 103 is provided such that the distance between the center of the actuator 102-3 and the magnetic sensor 103 is shorter than the center of the actuator 102-i and the magnetic-type sensor 103, at a position outside the seat 409. For example, the magnetic sensor 103 is orientated in a direction along the winding central axis of the coil 1024-3 wound within the actuator 102-3 (i.e. the coil 1024-3 is wound around the winding central axis). As described above, when a current is applied to the coil 1024-3, a magnetic field penetrating the winding central axis of the coil 1024-3 is generated. For example, the magnetic sensor 103 is orientated in the direction of the magnetic field lines penetrating the winding central axis of the coil 1024-3. This direction is a direction along the D-2 axis, and a direction in which the magnetic flux density of the magnetic field leaking from the actuator 102-3 is large. An object of the magnetic sensor 103 is to measure the external magnetic field of the pseudo force sensation generation device 1, and the magnetic field leaking from the actuator 102-3 hinders the achievement of this object. Note that the location of the magnetic sensor 103 is not limited in this way, and the magnetic sensor 103 may be provided in the vicinity of the actuator 102-3 or at another position.

<Shielding Member 101>

The shielding member 101 shields at least a magnetic wave from the actuator 102-3 that hinders the measurement of the external magnetic field by the magnetic sensor 103. The shielding member 101 is a ferromagnet that shields a magnetic wave that has a frequency component that is based on a control signal (a control current or a control voltage) supplied to the actuator 102-3. That is to say, in order to make the user perceive a pseudo force sensation using the pseudo force sensation generation device 1, it is necessary to periodically drive the actuator 102-3 at a low frequency (for example, about 10 Hz to 150 Hz), and the frequency of the magnetic field leaking from such an actuator 102-3 is also low. The shielding member 101 is a member that is made of a material that shields such a low-frequency magnetic field. For example, the shielding member 101 is made of a material that shields at least a magnetic field (a magnetic wave) in a specific frequency band included in the range of 10 Hz to 150 Hz, and is, for example, made of a material that shields a magnetic field having a frequency of 80 Hz or near 80 Hz. An example of the material of the shielding member 101 is a permalloy or the like. The shielding member 101 is provided between the actuator 102-3 and the magnetic sensor 103, and surrounds a portion of the actuator 102-3 on the side of the magnetic sensor 103 (for example, the area of the actuator 102-3 that faces the magnetic sensor 103), to block a magnetic field on the side of the magnetic sensor 103 generated by the actuator 102-3. For example, the shielding member 101 is provided between the coil 1024-3 of the actuator 102-3 and the magnetic sensor 103. For example, the shielding member 101 is provided so as to surround the magnetic sensor 103 and an area extending outward of the magnetic sensor 103, of the area outside the coil 1024-3 of the actuator 102-3. For example, the shielding member is orientated in a direction along the winding central axis of the coil 1024-3. Although the shape of the shielding member 101 is not limited, the shielding member 101 illustrated in FIGS. 1 to 3 and 5 is formed into a U shape from a single layer or multilayer strip-shaped member. The shielding member 101 is fixed to the plate surface 401*b* of the base portion 401 so as to surround a portion on the side of the magnetic sensor 103 (a portion on the side of the coupling portion 102*eb*-3) of the actuator 102-3. A plate surface 101*a* of the shielding member 101 is substantially orthogonal to the plate surface 401*b* of the base portion 401, and the inner plate surface 101*a* of the shielding member 101 is provided so as to surround an area around the actuator 102-3 on the side of the magnetic sensor 103.

<Operations>

Operations of the pseudo force sensation generation device 1 will be described with reference to FIG. 5. The user grips the pseudo force sensation generation device 1 in a state where their skin is in contact with the contact portion 408, or a piece of cloth or the like is interposed between the skin and the contact portion 408.

Upon the actuator 102-3 being driven, the movable portion 1025-3, the coupling portions 102*ea*-3 and 102*eb*-3, and the coupling portion 2045-3 perform asymmetric vibration in the XA4-XB4 direction along the D-2 axis. Accordingly, a force is applied to the connection portion 403 supported by the coupling portion 2045-3, in a direction along the D-2 axis, and a force is also applied to the contact portion 408 supported by the connection portion 403, in a direction along the D-2 axis. Thus, the contact portion 408 performs asymmetric vibration together with the movable portion 1025-3, the coupling portions 102*ea*-3 and 102*eb*-3, and the coupling portion 2045-3. As a result, a force that is based on the asymmetric vibration is applied to the skin that is in direct or indirect contact with the contact portion 408. The force applied to the contact portion 408 in a direction along the D-2 axis is applied to the leaf spring portions 1043-1 and 1044-1 and the fixing portion 4045-1. Thus, the leaf spring portions 1043-1 and 1044-1 elastically deform (bend) in a direction along the D-2 axis. Thus, the asymmetric vibration of the contact portion 408 along the D-2 axis is prevented from being hindered by the actuator 102-1, and pseudo force sensation can be efficiently provided from the contact portion 408 supported by the connection portion 403.

On the other hand, upon the actuator 102-1 being driven, the movable portion 1025-1 and the coupling portions 102*ea*-1, 102*eb*-1, 1041-1, and 1042-1 perform asymmetric vibration in the YA4-YB4 direction along the D-1 axis. Accordingly, a force is applied to the leaf spring portions 1043-1 and 1044-1 and the fixing portion 4045-1 supported by the coupling portions 1041-1 and 1042-1, in a direction along the D-1 axis. Thus, the leaf spring portions 1043-1 and 1044-1 perform asymmetric vibration in the YA4-YB4 direction along the D-1 axis together with the movable portion 1025-1 and the coupling portions 102*ea*-1, 102*eb*-1, 1041-1, and 1042-1. The leaf spring portions 1043-1 and 1044-1 to which a force is applied from the coupling portions 1041-1 and 1042-1 in a direction along the D-1 axis apply a force to the fixing portion 4045-1 in a direction along the D-1 axis. The fixing portion 4045-1 applies a force in this direction, to the connection portion 403 and the contact portion 408. Thus, the connection portion 403 and the contact portion 408 perform periodic asymmetric pivot movement about the insertion hole 2045*aa*-3 in the support portion 2045*a*-3 of the coupling portion 2045-3 (asymmetric pivot movement about the pivot shaft 4031 that is substantially orthogonal to the D-1 axis and the D-2 axis). Thus, a force that is based on the asymmetric pivot movement is applied to the skin that is in direct or indirect contact with the contact portion 408. Also, the asymmetric vibration of the contact portion 408 along the D-1 axis is prevented from being hindered by the actuator 102-3, and pseudo force sensation can be efficiently applied to the skin that is in direct or indirect contact with the contact portion 408.

The same applies to the case in which the actuator 102-1 and the actuator 102-3 are simultaneously driven.

The magnetic sensor 103 measure an external magnetic field (for example, geomagnetism) of the pseudo-force sense generator 1. At this time, even if the actuator 102-3 is driven, the magnetic field leaking from the actuator 102-3 is blocked by the shielding member 10. Therefore, it is possible to prevent the measurement of the external magnetic field performed by the magnetic sensor 103 from being hindered by the influence of the magnetic field leaking from the actuator 102-3, and it is possible to accurately measure the external magnetic field using the magnetic sensor 103. The actuator 102-1 is located away from the magnetic sensor 103, and the shielding member 101 for blocking the magnetic field generated by the actuator 102-3 is provided between the actuator 102-1 and the magnetic sensor 103. That is to say, due to the arrangement of the actuators 102-1 and 102-3 and the shielding member 101, the shielding member 101 can also be used to block not only the magnetic field leaking from the actuator 102-3 but also the magnetic field leaking from the actuator 102-1. Therefore, it is possible to prevent the measurement of the external magnetic field performed by the magnetic sensor 103 from being hindered by the influence of the magnetic field leaking from the actuator 102-1.

Second Embodiment

A second embodiment will be described. This embodiment is a modification from the first embodiment. The second embodiment is different from the first embodiment in the configuration of contact portions. The other components are the same as in the first embodiment.

A pseudo force sensation generation device 2 according to the present embodiment will be described with reference to FIGS. 6A to 6C and FIG. 7. As illustrated in FIGS. 6A to 6C and 7, the pseudo force sensation generation device 2 according to the present embodiment includes the base portion 401, the actuators 102-*i* (where i=1, 3), the leaf spring portions 1043-1 and 1044-1, the coupling portions 1041-1 and 1042-1, the fixing portion 4045-1, the coupling portion 2045-3, the seat 409, the connection portion 403, a contact portion 508, the shielding member 101, and the magnetic sensor 103. The actuator 102-*i* (where i=1, 3) includes the support portion 1026-*i*, the movable portion 1025-*i*, the coupling portion 102*ea*-*i*, and the coupling portion 102*eb*-*i*.

The contact portion 508 is a rigid member or a member that can be regarded as a rigid member. The contact portion 508 includes a first area 5081 located on the side of one surface 401*b* of the base 401, a second area 5082 that is supported by one end of the first area 5081, and a third area 5083 that is supported by the other end of the second area 5082 and is located on the side of the other surface 401*a* of the base portion 401 (on the side of the other surface of the base mechanism). The first area 5081, the second area 5082, and the third area 5083 each have a substantially plate-like shape. In the present embodiment, the substantially plate-shaped portion of the first area 5081 and the substantially plate-shaped portion of the third area 5083 are arranged so as to be substantially parallel with each other, and the substantially plate-shaped portion of the second area 5082 is substantially orthogonal to them. The cylindrical protrusion 4081 described in the first embodiment is provided in a central portion of one plate surface 5081*b* of the first area 5081. The connection portion 403 is orientated such that the plate surface 4033 faces toward the plate surface 409*b* of the seat 409. The pivot shaft 4031 of the connection portion 403 is pivotally supported in the insertion hole 2045*aa*-3. The protrusion 4045*a*-1 of the fixing portion 4045-1 is inserted into the through hole 4034 of the connection portion 403 from the plate surface 4033 side. The cylindrical protrusion 4081 of the contact portion 508 is inserted into the through hole 4034 of the connection portion 403 from the plate surface 4032 side. The protrusion 4045*a*-1 that penetrates through the through hole 4034 is inserted into and fixed to the inner wall surface of the cylindrical protrusion 4081. Thus, the first area 5081 is supported by the fixing portion 4045-1. Also, at least a portion of the mechanism that includes the seat 409 and the support portions 1026-1 and 1026-3, at least a portion of the mechanism that includes the movable portion 1025-1 and the coupling portions 102*ea*-1, 102*eb*-1, 1041-1, and 1042-1, and at least a portion of the mechanism that includes the leaf spring portions 1043-1 and 1044-1 and the fixing portion 4045-1 are located between the first area 5081 and the third area 5083.

Figure 7:
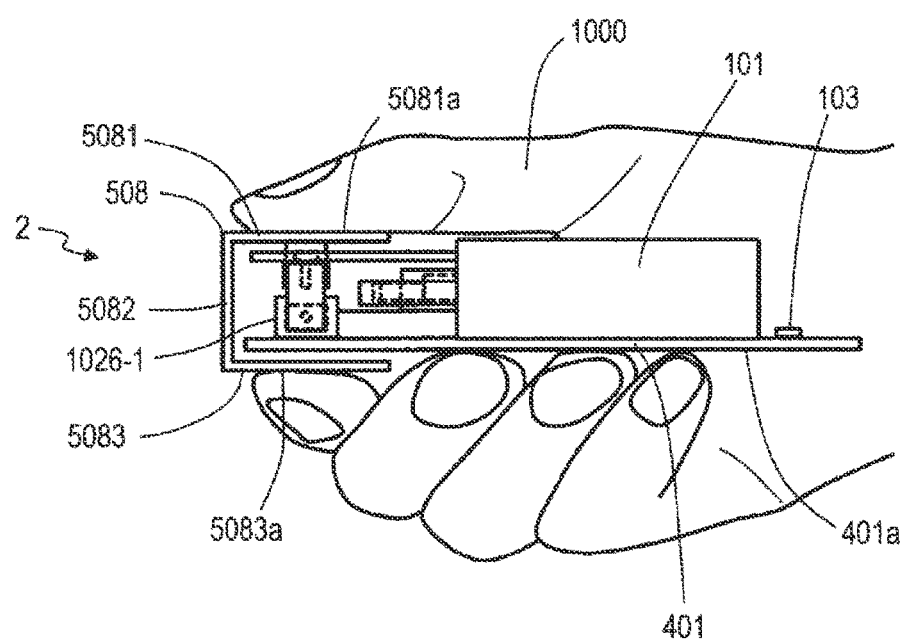
FIG. 7 is a conceptual diagram for illustrating a usage state of the pseudo force sensation generation device according to the second embodiment.

As illustrated in FIG. 7, the user supports the mechanism (base mechanism) that includes the seat 409 and the support portions 1026-1 and 1026-3 with their palm 1000, and also grips a plate surface 5081*a* outside the first area 5081 and the plate surface 5083*a* outside the third area 5083 of the contact portion 508 so as to sandwich them. In this state, the pseudo force sensation generation apparatus 2 is driven and the contact portion 508 is caused to perform asymmetric movement. As a result, the user perceives force sensation that is based on the asymmetric movement. As in the present embodiment, if the user grips the contact portion 508 so as to sandwich the first area 5081 and the third area 5083, at least a portion of the force applied from the user's thumb to the first area 5081 is applied to the third area 5083 via the second area 5082, and this third area 5083 is supported by the user's index finger. As a result, the force that the user applies to the first area 5081 is prevented from being applied to the actuators 102-1 and 102-3, and the load applied to the actuators 102-1 and 102-3 can be reduced. As a result, it is possible to reduce wearing of the actuators 102-1 and 102-3 and prevent the movement of the actuators 102-1 and 102-3 from being hindered, and it is possible to reduce the failure rate, and efficiently provide the user with force sensation.

[Experiment Data]

FIGS. 8 to 10 show experiment data that shows the experiment results showing the effect of magnetic shielding in the above-described embodiments. In this experiment, a member formed by stacking two sheets (MAGNEFILM-MFM) that are each formed by adding a specially processed layer to a piece of magnetic foil were used as the shielding member 101. However, similar results can be obtained by stacking seven permalloy sheets.

FIGS. 8A, 8B, and 8C illustrate graphs respectively illustrating changes in magnetic flux density [$\mu$T] in the x-axis direction, the y-axis direction, and the z-axis direction measured by the magnetic sensor 103, plotted at each point in time [s] in the case where a magnetic field generated by the actuator 102-3 is not shielded (NOT SHIELDED) and the actuator 102-3 is not driven (NOT DRIVEN). FIGS. 8D, 8E, and 8F illustrate graphs respectively illustrating changes in magnetic flux density [$\mu$T] in the x-axis direction, the y-axis direction, and the z-axis direction measured by the magnetic sensor 103, plotted at each point in time [s] in the case where the magnetic field generated by the actuator 102-3 is not shielded (NOT SHIELDED) and the actuator 102-3 is driven (DRIVEN). In FIG. 8, the horizontal axes indicate time [s] and the vertical axis indicate the magnetic flux density [$\mu$T] in the respective axial directions. Note that the x-axis and the y-axis are orthogonal axes that extend along the plate surface 401*b*, the x-axis is an axis that extends in the D-1 direction, and the y-axis is an axis that extends in the D-2 direction. The z-axis is an axis that is orthogonal to the plate surface 401*b* (x-y axes plane). It can be seen that in such a state where the magnetic field generated by the actuator 102-3 is not blocked, it was difficult to discern a weak external magnetic field due to the influence of the strong magnetic field generated through the driving of the actuator 102-3.

FIGS. 9A, 9B, and 9C illustrate graphs respectively illustrating changes in magnetic flux density [$\mu$T] in the x-axis direction, the y-axis direction, and the z-axis direction measured by the magnetic sensor 103, plotted at each point in time [s] in the case where the magnetic field generated by the actuator 102-3 is shielded by the shielding member 101 and the actuator 102-3 is not driven. FIGS. 9D, 9E, and 9F illustrate graphs respectively illustrating changes in magnetic flux density [$\mu$T] in the x-axis direction, the y-axis direction, and the z-axis direction measured by the magnetic sensor 103, plotted at each point in time [s] in the case where the magnetic field generated by the actuator 102-3 is blocked by the shielding member 101 and the actuator 102-3 is driven. Also, in FIG. 9, the horizontal axes indicate time [s] and the vertical axes indicate the magnetic flux density [$\mu$T] in the respective axial directions. It can be seen that it is possible to reduce the influence of a strong magnetic field generated by the driving of the actuator 102-3 by using the shielding member 101 to block the magnetic field generated by the actuator 102-3 so that a weak external magnetic field can be easily discerned.

FIGS. 10A, 10B, and 10C illustrate graphs respectively illustrating changes in power spectrum density in the x-axis direction, the y-axis direction, and the z-axis direction plotted at each frequency [Hz] in the case where the magnetic field generated by the actuator is not blocked and the actuator is not driven. FIGS. 10D, 10E, and 10F illustrate graphs respectively illustrating changes in power spectrum density in the x-axis direction, the y-axis direction, and the z-axis direction plotted at each frequency [Hz] in the case where the magnetic field generated by the actuator is not blocked and the actuator is driven. FIGS. 11A, 11B, and 11C illustrate graphs respectively illustrating changes in power spectrum density in the x-axis direction, the y-axis direction, and the z-axis direction plotted at each frequency [Hz] in the case where the magnetic field generated by the actuator is not blocked and the actuator is driven. FIGS. 11D, 11E, and 11F illustrate graphs respectively illustrating changes in power spectrum density in the x-axis direction, the y-axis direction, and the z-axis direction plotted at each frequency [Hz] in the case where the magnetic field generated by the actuator is not blocked and the actuator is driven. In FIGS. 10 and 11, the horizontal axes indicate a frequency [Hz] and the vertical axes indicate the power spectral density in the respective axial directions. These drawings also show that, in a state where the magnetic field generated by the actuator 102-3 is not blocked, it was difficult to discern a weak external magnetic field due to the influence of the strong magnetic field generated through the driving of the actuator 102-3, whereas, when the magnetic field generated by the actuator 102-3 is blocked using the shielding member 101, a weak external magnetic field can be easily decerned.

Figure 12A:
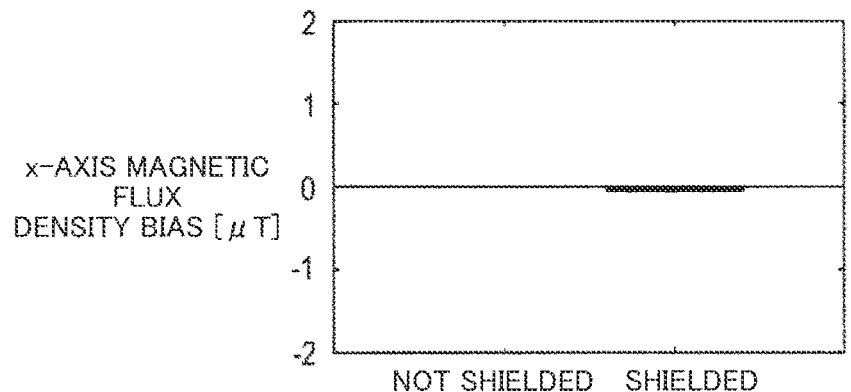
FIGS. 12A, 12B, and 12C are graphs respectively illustrating a bias (µT) of a magnetic flux density in the x-axis direction, the y-axis direction, and the z-axis direction in the case where the magnetic field generated by the actuator is not blocked (NOT SHIELDED) and in the case where it is blocked (SHIELDED).
Figure 12B:
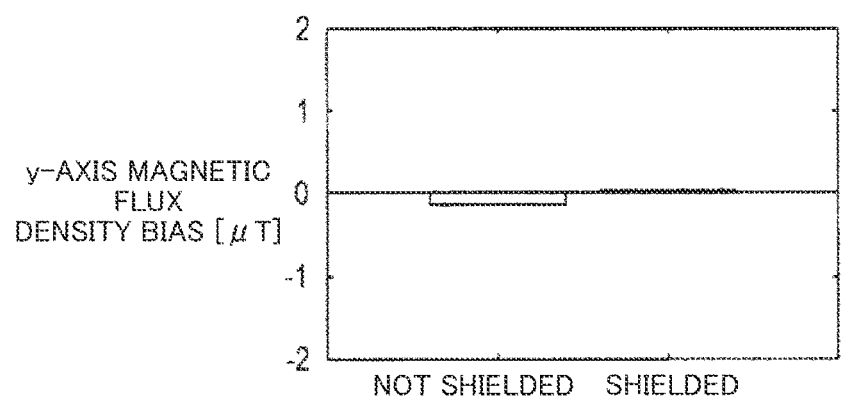
Figure 12C:
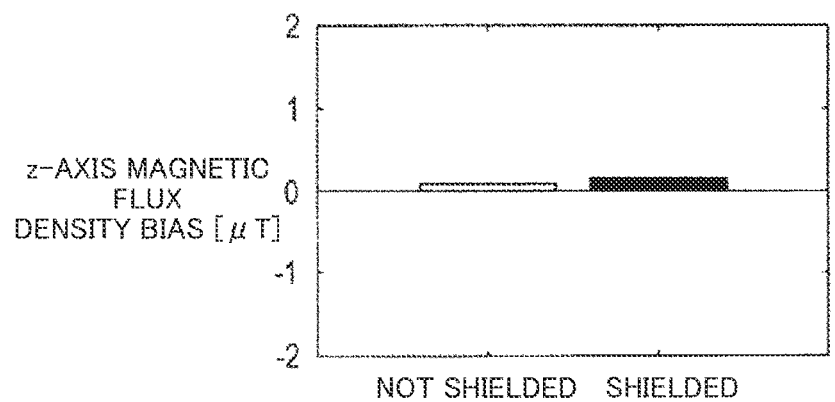

FIGS. 12A, 12B, and 12C are graphs respectively illustrating the bias (average) (μT) of a magnetic flux density in the x-axis direction, the y-axis direction, and the z-axis direction in the case where the magnetic field generated by the actuator 102-3 is not blocked (NOT SHIELDED) and in the case where it is blocked (SHIELDED). As shown in these drawings, it can be seen that, when the actuator 102-3, the shielding member 101, and the magnetic sensor 103 are appropriately arranged, the bias of the magnetic flux density does not significantly vary in the respective axial directions regardless of whether or not the magnetic field generated by the actuator 102-3 is blocked by the shielding member 101.

Figure 13A:
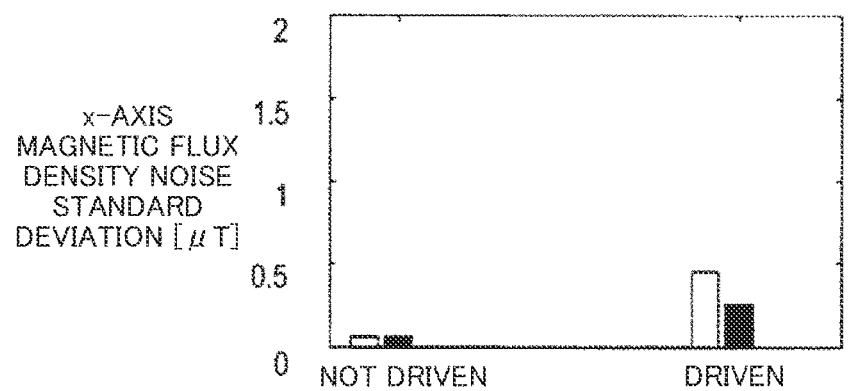
FIGS. 13A, 13B, and 13C are graphs respectively illustrating a standard deviation (µT) of magnetic flux density noise in the x-axis direction, the y-axis direction, and the z-axis direction in the case where the actuator is not shielded (NOT SHIELDED) and the case where the actuator is shielded (SHIELDED) when the actuator is driven and is not driven.
Figure 13B:
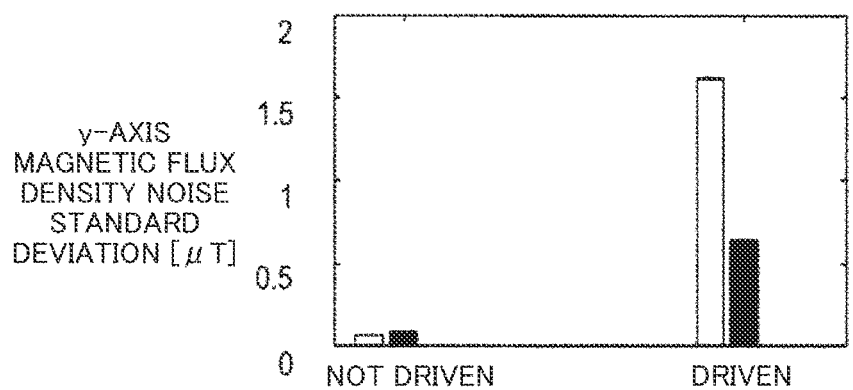
Figure 13C:
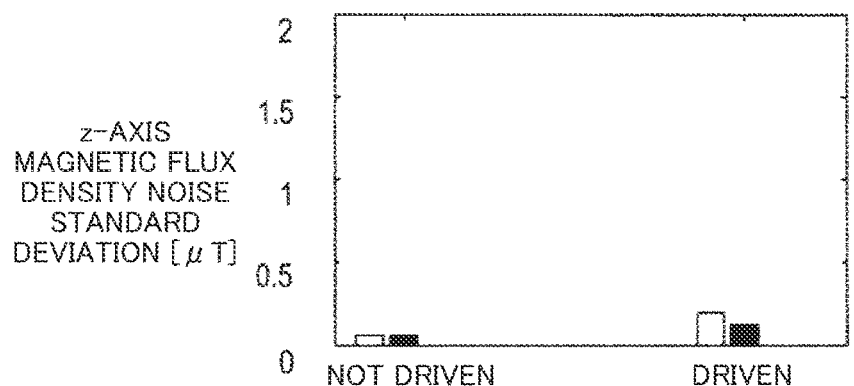

FIGS. 13A, 13B, and 13C are graphs respectively illustrating the standard deviation (μT) of magnetic flux density noise in the x-axis direction, the y-axis direction, and the z-axis direction in the case where the actuator 102-3 is not shielded (NOT SHIELDED) and the case where the actuator is shielded (SHIELDED) when the actuator 102-3 is driven and is not driven. The white graphs correspond to the case where there is no shield used and the black graphs correspond to the case where there is a shield. As shown in these drawings, it can be seen that, by appropriately arranging the actuator 102-3, the shielding member 101, and the magnetic sensor 103, it is possible to reduce changes in the standard deviation of magnetic flux noise regardless of whether or not the actuator 102-3 is driven or whether or not there is a shield.

[Other Modifications, Etc.]

Note that the present invention is not limited to the above-described embodiments. For example, the present invention may be applied to other pseudo force sensation generators such as those disclosed in Reference Literature 1, Reference Literature 2 "Japanese Patent No. 4413105", Reference Literature 3 "Japanese Patent No. 4551448", Reference Literature 4 "Japanese Patent No. 4658983", Reference Literature 5 "Japanese Patent No. 5158879", Reference Literature 6 "Japanese Patent No. 5458005", and Reference Literature 7 "Japanese Patent Application Publication No. 2012-143054".

The various kinds of processing described above are not necessarily sequentially executed according to the description, and may also be executed in parallel or individually depending on the processing capabilities of the device that executes the processing or according to the need. In addition, as a matter of course, it is possible to variously modify the present invention as appropriate without departing from the spirit of the present invention.

REFERENCE SIGNS LIST 1, 2 Pseudo force sensation providing device
101 Shielding member
103 Magnetic sensor
102-$i$ Actuator
1025-$i$ Movable portion 1025-$i$ (Contact mechanism)
102$ea$-$i$, 102$eb$-$i$ Coupling portion (Contact mechanism)
1043-1, 1044-1 Leaf spring portion (Contact mechanism)
4045-1 Fixing portion (Contact mechanism)
2045-3 Coupling portion (Contact mechanism)
403 Connection portion (Contact mechanism)
408, 508 Contact portion (Contact mechanism)

The invention claimed is:

1. A pseudo force sensation providing device comprising:
an electrical actuator configured to perform physical movement based on a control signal supplied thereto;
a contact mechanism configured to perform periodic asymmetric movement that causes a user to perceive pseudo force sensation, based on physical movement of the actuator;
a magnetic sensor configured to sense an external magnetic field, wherein the external magnetic field originates from external to the actuator; and
a shielding member that is provided between the actuator and the magnetic sensor, and surrounds a facing portion of the actuator that faces the side of the magnetic sensor, to block, at the side of the magnetic sensor, a magnetic field generated by the actuator.

2. The pseudo force sensation providing device according to claim 1, wherein the shielding member includes a ferromagnet, the ferromagnet blocking a magnetic field with a frequency based on the control signal.

3. The pseudo force sensation providing device according to claim 2, wherein the actuator includes a coil that is wound therearound, and a magnetic field that penetrates through a winding central axis of the coil is generated as a result of a current flowing through the coil, the magnetic sensor and the shielding member are orientated in a direction along the winding central axis of the coil, and the shielding member is provided between the coil and the magnetic sensor.

4. The pseudo force sensation providing device according to claim 2, wherein the frequency includes a range of frequency where the magnetic field is blocked.

5. The pseudo force sensation providing device according to claim 2, wherein the shielding member is in a U shape form surrounding at least an area around the actuator.

6. A method of providing pseudo force sensation, the method comprising:
performing, by an electrical actuator physical movement based on a control signal supplied thereto;
performing, by a contact mechanism periodic asymmetric movement that causes a user to perceive pseudo force sensation, based on physical movement of the actuator;
sensing, by a magnetic sensor an external magnetic field, wherein the external magnetic field originates from external to the actuator; and
blocking, by a shielding member that is provided between the actuator and the magnetic sensor, at the side of the magnetic sensor, a magnetic field generated by the actuator, wherein the shielding member surrounds a facing portion of the actuator that faces the side of the magnetic sensor.

7. The method according to claim 6, wherein the shielding member includes a ferromagnet, the ferromagnet blocking a magnetic field with a frequency based on the control signal.

8. The method according to claim 7, wherein the actuator includes a coil that is wound therearound, and a magnetic field that penetrates through a winding central axis of the coil is generated as a result of a current flowing through the coil, the magnetic sensor and the shielding member are orientated in a direction along the winding central axis of the coil, and the shielding member is provided between the coil and the magnetic sensor.

9. The method according to claim 7, wherein the frequency component includes a range of frequency where the magnetic field is blocked.

10. The method according to claim 7, wherein the shielding member is in a U shape form surrounding at least an area around the actuator.

\* \* \* \* \*